United States Patent

Chilton et al.

[11] Patent Number: 5,164,093
[45] Date of Patent: Nov. 17, 1992

[54] APPARATUS AND METHOD FOR REMOVING METALLIC CONTAMINATION FROM FLUIDS USING SILICON BEADS

[75] Inventors: Shane R. Chilton, Scottsdale; Mark D. Griswold, Chandler, both of Ariz.

[73] Assignee: Motorola, Inc., Schaumburg, Ill.

[21] Appl. No.: 800,317

[22] Filed: Nov. 29, 1991

[51] Int. Cl.⁵ .................... H01L 21/306; B01D 39/06
[52] U.S. Cl. .................................. 210/688; 134/902; 210/167; 210/502.1; 210/807; 210/912; 437/939
[58] Field of Search ............... 148/DIG. 60; 210/167, 210/258, 259, 263, 500.1, 502.1, 688, 806, 807, 912, 483, 500.26, 503, 805; 134/902

[56] References Cited

U.S. PATENT DOCUMENTS

| | | | |
|---|---|---|---|
| 2,892,240 | 6/1959 | Frankenhoff | 210/500.1 |
| 4,256,587 | 3/1981 | Carnahan et al. | 210/688 |
| 4,530,765 | 7/1985 | Sabherwal | 210/688 |
| 4,645,605 | 2/1987 | Durham | 210/502.1 |
| 4,971,920 | 11/1990 | Miyashita et al. | 437/10 |
| 4,980,300 | 12/1990 | Miyashita et al. | 437/10 |
| 5,078,900 | 1/1992 | Wegner | 210/912 |

FOREIGN PATENT DOCUMENTS

| | | | |
|---|---|---|---|
| 53-29676 | 3/1978 | Japan | 437/939 |
| 53-37958 | 4/1978 | Japan | 210/500.1 |
| 58-200540 | 11/1983 | Japan | 437/939 |
| 60-158392 | 8/1985 | Japan | 210/500.1 |
| 62-87299 | 4/1987 | Japan | 134/902 |
| 63-207133 | 8/1988 | Japan | 134/902 |

OTHER PUBLICATIONS

Article—"Silicon Defects and their effect on integrated circuits", J. M. Matlock, Mostek, Carrollton, Tex., pp. 3-28, Date Unknown Websters II New Riverside University Dictionary, Copyright 1984 by Haughton Mifflin Company, Boston, Mass., p. 529.

Primary Examiner—Robert A. Dawson
Assistant Examiner—Joseph Drodge
Attorney, Agent, or Firm—Joe E. Barbee

[57] ABSTRACT

A method and apparatus is provided for removing metallic contamination from a fluid or liquid that passes through a recirculating system (10) that is used for cleaning and etching semiconductor wafers. A bath 11) and fluid is provided. A recirculated fluid flows through a silicon media, thereby removing the metallic contamination from the liquid. In a preferred embodiment, the silicon media is a plurality of silicon or polysilicon beads which provide a maximum surface area in a minimum of space. Additionally, removal of metallic contamination from the recirculating fluid is combined with particle filtration of the recirculating fluid single housing.

16 Claims, 1 Drawing Sheet

APPARATUS AND METHOD FOR REMOVING METALLIC CONTAMINATION FROM FLUIDS USING SILICON BEADS

BACKGROUND OF THE INVENTION

This invention relates, in general, to semiconductor processing, and more particularly, to removal of contamination during semiconductor processing.

At the present time, contamination reduction of fluids used for processing semiconductor wafers is focused on reduction and/or removal of particles from the fluids. Typically, reduction and removal of contamination or particles from the fluids are achieved by a filtration process that passes the fluid across a filtering medium. Generally, the filtering medium is made of an inert substance with a multitude of small pores that allow the fluid to pass from one side of the filter to the other while capturing the particles in the filtering medium as the fluid passes through. While reduction and removal of particles from fluids used in processing semiconductor wafers are very important, reduction and removal of particles do not remove metallic contamination in the fluid.

As semiconductor devices continue to shrink while at the same time increase in complexity, metallic contamination problems become more apparent and affect the semiconductor devices that are made on the semiconductor wafers. The metallic contamination of the semiconductor wafers during processing results in several problems with the semiconductor devices, such as degradation of time-dependent dielectric breakdown (TDDB), increased current junction leakage, and reduced lifetime of the semiconductor device. Ultimately, these problems result in reliability failures of the semiconductor device.

It can be readily seen that conventional particle contamination control of fluids used in processing semiconductor wafers is not sufficient to eliminate or to reduce metallic contamination. Additionally, because of the decreasing size of semiconductor devices and the increasing complexity of the semiconductor devices, problems with metallic contamination will increase. Therefore, an apparatus and method for removing metallic contamination from fluids used in semiconductor processing, as well as filtering fluids used in semiconductor processing would be highly desirable.

SUMMARY OF THE INVENTION

Briefly stated, a method is provided for removing metallic contamination from a circulating fluid. The circulating fluid flows over a silicon media, thereby removing the metallic contamination from the liquid. Additionally, a novel apparatus is shown that combines both particulate filtering and metallic gettering in a single housing.

DETAILED DESCRIPTION OF THE DRAWINGS

Figure 1:
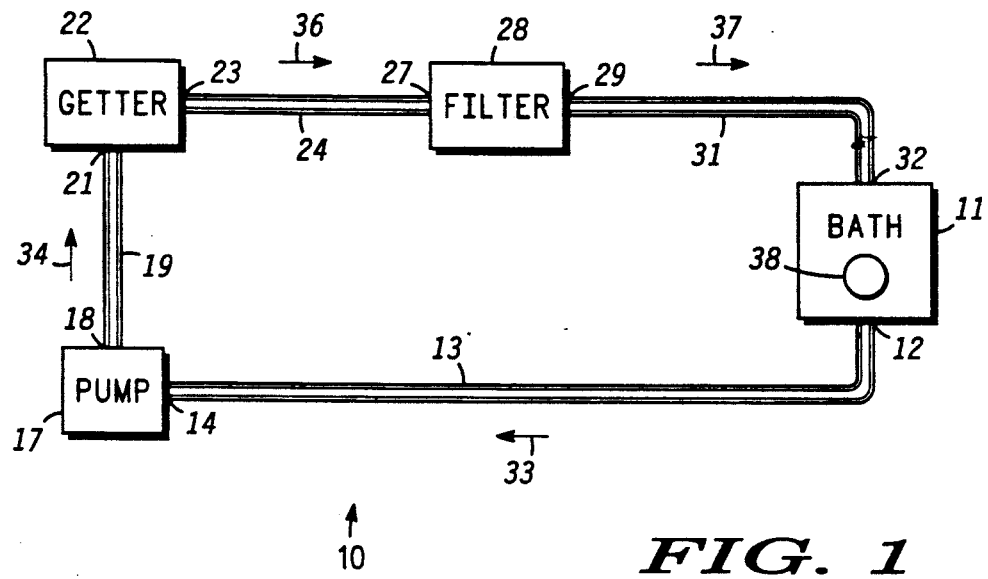
FIG. 1 is a simplified schematic diagram of a recirculating bath system, using an embodiment of the present invention.

FIG. 1 is a simplified schematic diagram of a recirculating system 10, using an embodiment of the present invention. Generally, recirculating system 10 is a closed-loop plumbing system which recirculates a fluid or a liquid continuously to and throughout all major components. Generally, fluids or solutions that are used in recirculating system 10 range from either strong acids to strong bases that are in an aqueous solution. Acids and bases typically are characterized by their pH values, with values lower than 7.0 denoting acidic solutions and values greater than 7.0 denoting basic solutions. Examples of common fluids or solutions used in processing semiconductor wafers are made of hydrofluoric acid (HF) and deionized water ($H_2O$) solutions, ammonium hydroxide ($NH_4OH$) and hydrogen peroxide ($H_2O_2$) solutions, and hydrochloric acid (HCl) and $H_2O_2$. Typically, the fluid or liquid used to fill recirculating system 10 is semiconductor grade or better; i.e., the fluid or liquid has been previous processed to an electronic grade standard of quality. However, contamination of the fluid or liquid with particles and metallics, such as copper, iron, zinc and chrome are still prevalent. Generally, bath 11 is made of readily available inert plastic materials, such as polypropylene or polyurethane. More specifically, sizing of length, width, and depth of bath 11 is dependent upon size of semiconductor wafer 38. It should be understood that larger semiconductor wafers require a larger bath size for use. Bath 11 is made in such a manner that an inlet and an outlet 12 are connected so that flow through the bath is produced.

Typically, plumbing elements or pipes 13, 19, 24, and 31 are made of readily available materials, such as polypropylene, polyurethane, or the like. Plumbing element or pipe 13 represents a plumbing connection from outlet 12 of bath 11 to inlet 14 of pump 17. Arrow 33 indicates direction of fluid movement from bath 11 to pump 17.

Pump 17 provides a force or pressure which moves the fluid to and throughout all major components of recirculating system 10. Typically, pump 17 is a nonreactive impeller type pump; however, other nonreactive type of pumps that are compatible with the fluid and the materials of recirculating system 10 may also be used. Direction of the fluid which is pumped out of pump 17 through outlet 18 and toward gettering device 22 is shown by arrow 34. Plumbing element or pipe 19 represents the plumbing connection between pump 17 and gettering device 22.

Fluid from pipe 19 is directed into gettering device 22 through inlet 21 Gettering device 22 removes or getters undesired metallic contamination from the circulating fluid. In the present invention, gettering device 22 represents a silicon or polysilicon media with a large surface area. In a preferred embodiment of the present invention, gettering device 22 is made of silicon or polysilicon beads to obtain a maximum surface area with a minimum of space. Silicon and polysilicon are considered to be interchangeable, and as used herein "silicon" is intended to include silicon as well as polysilicon. These beads are commercially available from Ethyl Corporation of Baton Rouge, La. In a preferred embodiment of the present invention, purity of the beads should be at least the purity of silicon used for making ingots; however, other purity levels of the beads can be used as well. Typically, a single silicon bead has a diameter approximately of one millimeter; however, other silicon bead sizes may be used depending upon specific design applications or requirements of recirculating system 10.

As the fluid flows through gettering device 22, metallic contamination in the fluid is reduced. It is believed that as the metallic contaminated fluid flows over the silicon media, the metallic contamination is deposited on the silicon media. More specifically, it is believed that a chemical reaction is achieved by an electrodeless chemical reaction. Thus, as the metallic contaminated fluid flows through the silicon media contained in gettering device 22, the metallic contamination is removed from the fluid. The fluid is then directed out of gettering device 22 through outlet 23 in plumbing connection or pipe 24 and into inlet 27 of filter 28. Direction of fluid flow is indicated by arrow 36. Additionally, it should be understood that removal of metallic contamination from the fluid generally is proportional to the surface area of the silicon media of gettering device 22; therefore, the larger the surface area of the silicon media of gettering device 22 the more readily metallic contamination is removed or eliminated from the fluid or solution.

Filter 28 typically is a particulate filter which removes particles from the fluid. Generally, filter 28 is made of a nonreactive membrane with a very small pore size. Typically, pore size of the nonreactive filtering membrane is dependent upon specific design applications; however, for advanced processing of semiconductor wafers, a pore size of 0.01 micron is used. The fluid is forced through the small pores in filter 28, thus filtering out particles larger than the pore size. Once the fluid is filtered, the fluid exits from outlet 29 and into plumbing connection or pipe 31. Direction of the fluid that exits from outlet 29 is indicated by arrow 37. Plumbing connection 31 is then connected to the inlet connection 32 on bath 11, thus completing the circuit for recirculating system 10.

By recirculating the fluid repeatedly over the silicon media in gettering device 22, the metallic contamination of the fluid is greatly reduced. One complete circulation of the fluid in recirculation system 10 is defined as one turn, whereas two complete circulations of the fluid in recirculation system are two turns and so on. Typically, the number of times the fluid has to be recirculated or the number of turns is dependent upon the amount of surface area of silicon beads in gettering device 22. It should be understood that by optimizing gettering device 22 use in an open system or passing the fluid once over the silicon media removes the metallic contamination from the passing fluid.

By way of example, with the solution being hydrofluoric acid diluted nine to one by volume in deionized water which has a total solution volume of 7.0 gallons, with the silicon beads being of one millimeter in size, and an amount of silicon beads being two and one half pounds and substantially filling the container of gettering device 22, the metallic contamination levels of zinc in the solution are substantially reduced or eliminated with ten turns of the fluid being recirculated through the silicon beads in gettering device 22. Measurement of zinc contamination levels were determined by Total X-ray Fluorescence (TXRF). TXRF is a surface analyses tool which is used to determine the amount of metallic contamination on surfaces in atoms per square centimeter. In this specific example, a silicon wafer is immersed into bath 11 prior to gettering resulting in zinc contamination levels of $1.0 \times 10^{11}$ atoms per square centimeter; however, after ten turns of the solution metallic contamination of zinc as measured on a silicon wafer is reduced to unmeasurable values. Thus, allowing the solution to turn ten times before immersing a semiconductor wafer or wafers 38 into bath 11 prevents the metallic contamination such as zinc of semiconductor wafer or wafers 38. Further, semiconductor device (not shown) which is made on semiconductor wafer 38 is not contaminated, thus improving TDDB, decreasing current junction leakage, and increasing lifetime of the semiconductor device.

In yet another example, with the solution being made 5 parts deionized $H_2O$, 1 part $NH_4OH$, and 1 part $H_2O_2$ with a total solution volume of 7.0 gallons, the silicon beads being of one millimeter in size, and an amount of silicon beads having a weight of two and one half pounds and substantially filling gettering device 22, the metallic contamination level of zinc prior to gettering as measured by TXFR is $4.0 \times 10^{12}$ atoms per square centimeter; however, after 30 turns the contamination level of zinc as measured on a silicon wafer is reduce to unmeasurable values.

As a result of not allowing the semiconductor wafer or wafers to be contaminated by metallic contamination, time-dependent dielectric breakdown (TDDB) increases, and junction current leakage decreases. Improvements in both TDDB and junction current leakage enhance the reliability of a semiconductor die made with less metallic contamination.

Figure 2:
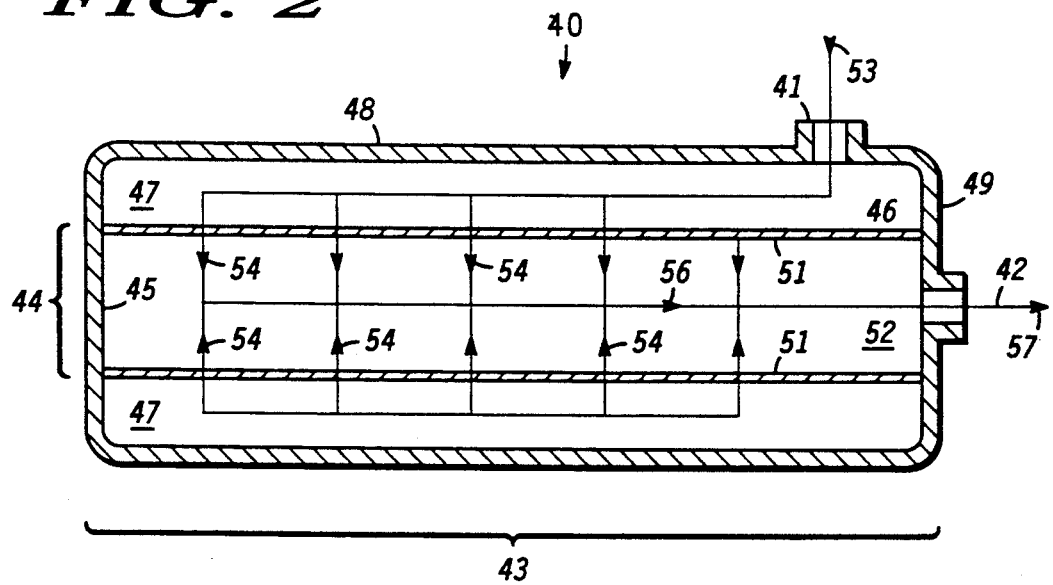
FIG. 2 is a cross-sectional view of a housing which combines both gettering and filtration in a single housing.

FIG. 2 is a simplified cross-sectional view of an enclosure or a housing that combines both gettering and filtration in a single enclosure or a single housing. In this embodiment of the present invention, gettering and filtration functions are combined to facilitate point-of-use filtration and gettering in a single housing. Point-of-use gettering and filtration device 40 includes an inlet 41, outlet 42, body 43, filter cartridge 44, and silicon beads 47. Silicon beads 47 substantially fill body 43 except for the space occupied by filter cartridge 4. Because of the small size and quantity of beads 47, they are not actually shown in FIG. 2 to avoid overcrowding the drawing. Body 43 is made of well-known nonreactive plastic materials or resins such as polyurethane or polypropylene. These plastic materials are easily shaped or made into a variety of shapes and sizes. In a preferred embodiment of the present invention, body 43 is shaped into a cylinder with a cavity. Also, body 43 is made with inlet 41 and outlet 2. Additionally, body 43 is divided into a main portion 8 and a cap portion 49. Typically, portion 48 and portion 49 are capable of being separated from each other by a threaded portion (not shown). Removal of cap portion 49 from main portion 48 allows access to the cavity of body 43. Also, point-of-use gettering and filtration device 40 is used by substituting point-of-use gettering and filtration device 40 for gettering device 22 and filter 28 shown in FIG. 1.

Generally, filter 44 is a cylindrically shaped tube with ends 45 and 46. Filter 44 is placed centrally in the cavity of body 43. Also, ends of filter 44 form a seal against portion 48 and upper portion 49 of body 43. Positioning filter 44 in such a manner further divides the cavity into areas that are separated by filtering media 51; thus area 47 is exterior to area 52, which is separated by filtering media 51. Area 47 is filled with a silicon media that provides a large surface area. For example, area 47 is filled with polysilicon beads that are approximately 1.0 millimeter in diameter and have a total weight of approximately 2.5 pounds.

Fluid is directed into gettering and filtration device 40 via inlet 41. Arrow 53 represents the direction of the fluid moving through inlet 41. Once the fluid is directed into point-of-use gettering and filtration device 40, the fluid is dispersed through the silicon media contained in area 47. It should be understood that area 47 is cylindrical in shape and surrounds filtering media 51, thereby allowing the fluid to pass through cylindrical filtering media 51 from all directions. Generally, fluid flows throughout the silicon media, where the metallic contamination in the fluid is deposited or plated onto the silicon media contained in area 47. As the fluid contacts and flows through filtering media 51, particulate contamination is removed from the fluid by filtering media 51. Movement of the fluid from area 47 through filtering membrane 51 and into area 52 is represented by arrows 54. As a flow of fluid continues, it is driven through cavity 52 toward outlet 42 as shown by arrow 56 and out of point-of-use gettering and filtration device 40 through outlet 42. Arrow 57 represents the output of the fluid as it is removed from the point-of-use gettering and filtration device 40.

Combining both the gettering and the filtration functions in a single housing allows for advantages, such as substantial savings in space, ease of manufacturing the gettering filtration device 40, while removing metallic contamination from the fluid, thus improving performance of TDDB, current junction leakage, and reliability.

By now it should be appreciated that a method and apparatus has been provided for reducing or eliminating metallic contamination in liquid baths. Additionally, by reducing the metallic contamination in a liquid bath that is used for making semiconductor devices, an improvement in TDDB and current junction leakage is realized.

We claim:

1. A method for removing metal contamination from a flowing fluid comprising:
   providing a flowing fluid;
   using a silicon media having a plurality of beads essentially comprised of silicon for a gettering device; and
   flowing the fluid through the silicon media, thereby removing metallic contamination from the fluid.

2. The method of claim 1 wherein the flowing fluid has an allowable range from a strong acid to a strong base.

3. The method of claim 1 further comprising filtering particles from the fluid after it passes the silicon media.

4. The method of claim 1 wherein the removing of the metal ionic contamination includes removing of one or more metal ions selected from teh group consisting of zinc, iron, copper, and chrome.

5. A method for removing metal contamination from a flowing fluid comprising:
   providing a flowing fluid;
   using a silicon media having a plurality of silicon beads for a gettering device; and
   flowing the fluid through the silicon beads, thereby removing metallic contamination from the fluid, wherein the using of the silicon media is achieved by having the silicon media be polysilicon beads.

6. A method for removing metal ionic contamination from a recirculating liquid bath comprising:
   providing a recirculating liquid bath; and
   passing a liquid from the recirculating liquid bath across a silicon media in the form of a plurality of spherical or oval bodies, thereby removing metal ionic contamination from the liquid recirculating through the recirculating liquid bath.

7. The method of claim 6 wherein the liquid consists at least in part of hydrogen peroxide.

8. The method of claim 6 wherein the liquid consists at least in part of hydrofluoric acid.

9. The method of claim 6 wherein the removing of the metal ionic contamination includes removing of one or more metal ions selected from the group consisting of zinc, iron, copper, and chrome.

10. The method of claim 6 further comprising filtering particles from the liquid of the recirculating liquid bath.

11. A method for reducing metallic contamination of a semiconductor wafer comprising:
    providing a semiconductor wafer with at least one semiconductor device on the semiconductor wafer; and
    immersing the semiconductor wafer in a bath in which a fluid has been gettered by filter media in the form of spherical or oval bodies in a recirculation system, thereby reducing metallic contamination on the semiconductor device.

12. A wet chemical gettering apparatus comprising:
    a tank having an inlet and an outlet;
    a pump having an inlet and an outlet, wherein the pump inlet connects to the tank outlet; and
    a polysilicon beaded media gettering device positioned between the pump and the tank.

13. The wet chemical gettering apparatus of claim 12 further comprising a particle removing filter placed between the polysilicon beaded media and the tank.

14. The wet chemical gettering apparatus of claim 13 wherein the particle remvoing filter removes particles of 0.01 microns and larger.

15. A gettering and particle removal filtration device comprising:
    an enclosure with an inlet and an outlet;
    a silicon gettering medium connected to the inlet of the enclosure, wherein a fluid first passes through the inlet of the enclosure and through the silicon gettering medium, and wherein the silicon gettering medium is comprised of beads essentially comprised of silicon; and
    a particle removing filtration medium arranged to receive gettered fluid from the silicon gettering media, wherein the fluid is filtered as the fluid is passed to the outlet of the enclosure.

16. The gettering and particle removal filtration device of claim 15 further including the use of the device in a liquid recirculation system to clean a semiconductor wafer.

* * * * *